(12) United States Patent
Natsuhara et al.

(10) Patent No.: US 7,576,303 B2
(45) Date of Patent: Aug. 18, 2009

(54) WAFER HOLDER, AND WAFER PROBER PROVIDED THEREWITH

(75) Inventors: Masuhiro Natsuhara, Itami (JP); Tomoyuki Awazu, Itami (JP); Hirohiko Nakata, Itami (JP); Katsuhiro Itakura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/701,417

(22) Filed: Feb. 2, 2007

(65) Prior Publication Data
US 2007/0205788 A1 Sep. 6, 2007

(30) Foreign Application Priority Data
Feb. 21, 2006 (JP) ............................. 2006-043803

(51) Int. Cl.
*H05B 3/68* (2006.01)
*C23C 16/00* (2006.01)
(52) U.S. Cl. .................................... 219/444.1; 118/724
(58) Field of Classification Search ... 219/443.1–468.2; 118/724, 725
See application file for complete search history.

(56) References Cited

U.S. PATENT DOCUMENTS

| | | | | |
|---|---|---|---|---|
| 5,851,298 A | * | 12/1998 | Ishii | ........................... 118/728 |
| 6,639,189 B2 | * | 10/2003 | Ramanan et al. | ......... 219/444.1 |
| 2004/0169033 A1 | * | 9/2004 | Kuibira et al. | ........... 219/444.1 |

FOREIGN PATENT DOCUMENTS

| | | |
|---|---|---|
| JP | 2001-033484 | 2/2001 |
| JP | 2004-014655 | 1/2004 |
| JP | 2004-363372 A | 12/2004 |

* cited by examiner

*Primary Examiner*—Sang Y Paik
(74) *Attorney, Agent, or Firm*—Global IP Counselors, LLP

(57) ABSTRACT

A wafer holder is provided having high rigidity and an enhanced heat-insulating effect that allow positional accuracy and heating uniformity to be improved, a chip to be rapidly heated and cooled, and the manufacturing cost to be reduced, and a wafer prober apparatus on which the wafer holder is mounted. The wafer holder of the present invention includes a chuck top for mounting a wafer, a support member for supporting the chuck top, and a stand for supporting the support member. The chuck top has a thermal conductivity $K1$ and a Young's modulus $Y1$; the support member has a thermal conductivity $K2$ and a Young's modulus $Y2$; and the stand has a thermal conductivity $K3$ and a Young's modulus $Y3$. $K1>K2$ and $K1>K3$; and $Y3>Y1$ and $Y3>Y2$.

8 Claims, 2 Drawing Sheets

WAFER HOLDER, AND WAFER PROBER PROVIDED THEREWITH

BACKGROUND OF THE INVENTION

1. Field of the Invention

The present invention relates to a wafer holder having exceptional rigidity and heating uniformity, and in particular relates to a wafer holder and a heater unit used in a wafer prober for mounting a semiconductor wafer on a wafer-mounting surface and pressing a probe card against the wafer to inspect the electrical characteristics of the water, and to a wafer prober on which the wafer holder and the heater are mounted.

2. Description of the Background Art

In the prior art, a heating procedure is performed in a semiconductor inspection step on a semiconductor substrate (wafer) to be treated. Specifically, the wafer is heated to a temperature higher than the normal operating temperature, potentially defective semiconductor chips are made to fail at an accelerated rate and are removed, and a burn-in is performed to prevent the occurrence of defects after shipping. In the burn-in step, after the semiconductor circuits are formed on the semiconductor wafer and before the wafer is diced into individual chips, the electrical characteristics of each chip are measured while heating the wafer, and defective chips are removed. A strong demand has existed for the processing time to be reduced in the burn-in step in order to improve throughput.

In such a burn-in step, the semiconductor substrate is supported and heated using a heater. Since the entire reverse surface of the wafer must be in contact with a ground electrode, conventional heaters have been made of metal. A wafer on which circuits are formed is mounted on a metal flat plate heater, and the electrical characteristics of the chips are measured. A measuring instrument called a probe card, which is provided with numerous electrically conducting electrode pins, is pressed onto the wafer with a force of tens to hundreds of kilograms-force when the measurements are made. Therefore, if the heater is thin, the heater may be deformed, causing gaps to form between the wafer and the probe pins, and contact failure to occur. Therefore, the use of thick metal plates having a thickness of 15 mm or greater has been necessary in order to preserve rigidity such that the heater is not deformed. The heat capacity of the heater therefore becomes relatively large, and long periods are required for raising and lowering the temperature of the heater, which has become a large obstacle to improving throughput.

Additionally, in the burn-in step, electricity is applied to the chips, and the electrical characteristics are measured. However, with the increasing power output of chips in recent years, the chips generate large amounts of heat when the electrical characteristics are measured, and are sometimes damaged by the heat they generate. Rapid cooling after measurement has therefore been needed. Additionally, heating needs to be as uniform as possible during measurement. Copper (Cu), which has a high thermal conductivity of 403 W/mK, has therefore been used as the metal material.

Accordingly, in Japanese Laid-Open Patent Application Publication No. 2001-033484, a wafer prober is proposed wherein a thin metal layer and not a thick metal plate is formed on the surface of a thin but highly rigid ceramic substrate, resulting in minimized deformation and a low heat capacity. Since this wafer prober has high rigidity, contact failures do not occur. Since this wafer prober has low heat capacity, the temperature can be raised and lowered in a short time. Also disclosed is the use of an aluminum alloy, stainless steel or the like for the support member used to position the wafer prober.

However, if, as disclosed in Japanese Laid-Open Patent Application Publication No. 2001-033484, the wafer prober is only supported at the outermost periphery, the wafer prober may bend due to the pressure of the probe card. Therefore, measures such as providing a large number of support pillars or the like have been necessary.

Furthermore, with the scale of the semiconductor process decreasing over the past several years, a demand has arisen for increased load per unit area during probing and for precise alignment between the probe card and prober. The prober usually repeatedly performs an operation in which the wafer is heated to a predetermined temperature, and moved to a predetermined position during probing, whereupon a probe card is pressed on the wafer. In this case, high precision is also required in the drive system in order to move the prober to the predetermined position.

However, when the wafer is heated to a prescribed temperature; i.e., to about 100° C. to about 200° C., the heat is conveyed to the drive system, and problems have arisen in regard to a loss of precision due to thermal expansion of the metal components of the drive system. Furthermore, due to the increased load during probing, the wafer-holding prober itself must be rigid. Specifically, problems have been presented in that, if the wafer prober itself deforms under load during probing, the pins of the probe card will not be able to make uniform contact with the wafer, thereby rendering inspection impossible, or, in the worst case, damaging the wafer. For this reason, probers are made larger in order to inhibit deformation, and problems have arisen in that the weight of the prober increases and the increased weight affects the precision of the drive system. A problem also arises in that as the size of the prober increases, much more time is required to increase or reduce the temperature of the prober, and throughput decreases.

In order to improve throughput, cooling mechanisms are often provided to improve the heating and cooling rate of the prober. Conventionally, however, cooling mechanisms have employed air cooling, as in Japanese Laid-Open Patent Application Publication No. 2001-033484, for example, or envisaged the provision of a cooling plate directly below the metal heater. Problems have arisen in the former case in that the cooling rate of air cooling is low. Problems have also arisen in the latter case in that deformations in the metal cooling plate occur easily during probing due to the direct pressure applied to the cooling plate by the probe card.

In semiconductor production, heater units for heating semiconductor substrates and the like are used in order to heat and dry a resist solution applied to the substrate in the lithography step, for example. Efforts are being made to reduce the cost of products obtained by mass production based on continuous operation in such semiconductor manufacturing. Therefore, manufacturing apparatuses that will shorten the cycle time are desired. In order to obtain high throughput for a single apparatus, reductions are necessary not only in the processing time during periods when the temperature of the materials to be treated is maintained, but in the time necessary to change the heating temperature in accordance with changes in the processing conditions (heating time and cooling time). The temperature of the heater plate and the article to be treated, which is mounted on the heater plate, can be lowered in a short time by bringing cooling blocks having the desired heat capacity into contact with the heated heater plate, as in Japanese Laid-Open Patent Application Publication No. 2004-014655. The result is that a decrease in the time necessary for the heat treatment step is proposed. However, due to the existence of a boundary surface between the cooling blocks and the heater, problems have arisen in this invention in that contact resistance occurs and the cooling rate cannot be increased beyond a certain level.

SUMMARY OF THE INVENTION

A high-performance wafer prober can be provided if each member is composed of highly rigid materials. However, highly rigid materials are often materials that are difficult to process, and the cost of processing is often relatively high. The present invention solves such problems. Specifically, it is an object of the present invention to provide a highly rigid wafer holder having an enhanced heat-insulating effect, wherein the wafer holder is lightweight and can be inexpensively produced; and to provide a wafer prober apparatus on which the prober is mounted.

In the present invention, the above-mentioned problems are solved by using a material having high thermal conductivity in the parts that require heating uniformity, and using a material having a high Young's modulus in the parts that require rigidity. Specifically, the wafer holder of the present invention comprises a chuck top for mounting a wafer; a support member for supporting the chuck top; and a stand for supporting the support member, wherein the chuck top has a thermal conductivity K1 and a Young's modulus Y1; the support member has a thermal conductivity K2 and a Young's modulus Y2; the stand has a thermal conductivity K3 and a Young's modulus Y3; K1>K2 and K1>K3; and Y3>Y1 and Y3>Y2.

The chuck top is preferably supported by a part of a surface of the support member. By supporting the chuck top with a part of the surface of the support member and not with the entire surface of the support member, the contact area between the support member and the chuck top is reduced. As a result, the heat-insulating effect is further increased, while the wafer holder can be made lighter because the parts of the support member that do not contact the chuck top can be removed.

The thermal conductivity of the chuck top is preferably 100 W/mK or greater. The Young's modulus of the stand is preferably 200 GPa or greater.

The support member is preferably made of metal and formed by casting.

A heater unit provided with such a wafer holder, and a wafer prober provided with such a heater unit, are highly rigid and lightweight, and, via an improved heat-insulating effect, can improve positional accuracy, provide improved heating uniformity, heat and cool chips with greater speed, and allow other improvements.

According the present invention, it is possible to provide a lightweight, low-cost prober having an excellent heat insulation structure. A cooling module may also be installed to improve the cooling rate of the wafer holder. Reductions in the manufacturing cost of the wafer holder, improvements in the heating uniformity, and other improvements can also be achieved.

DETAILED DESCRIPTION OF THE INVENTION

Figure 1:
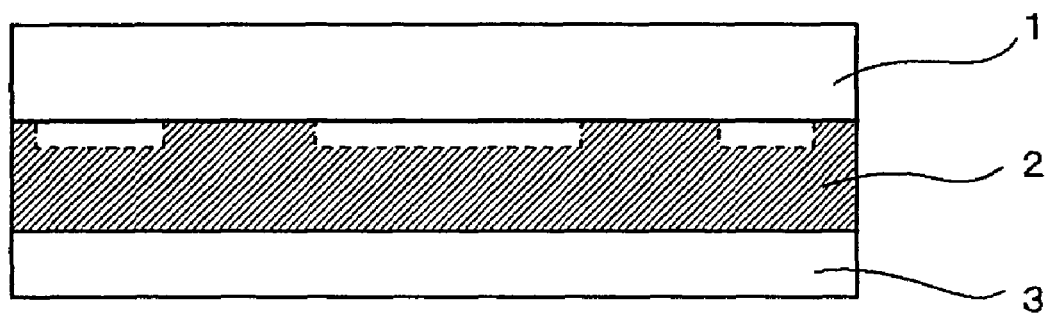
FIG. 1 shows an example of the cross-sectional structure of the wafer holder of the present invention.
Figure 2:
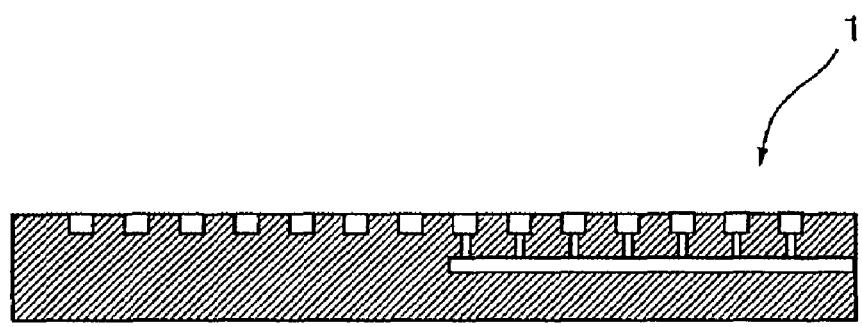
FIG. 2 shows an example of the cross-sectional structure of the chuck top according to the present invention.
Figure 3:
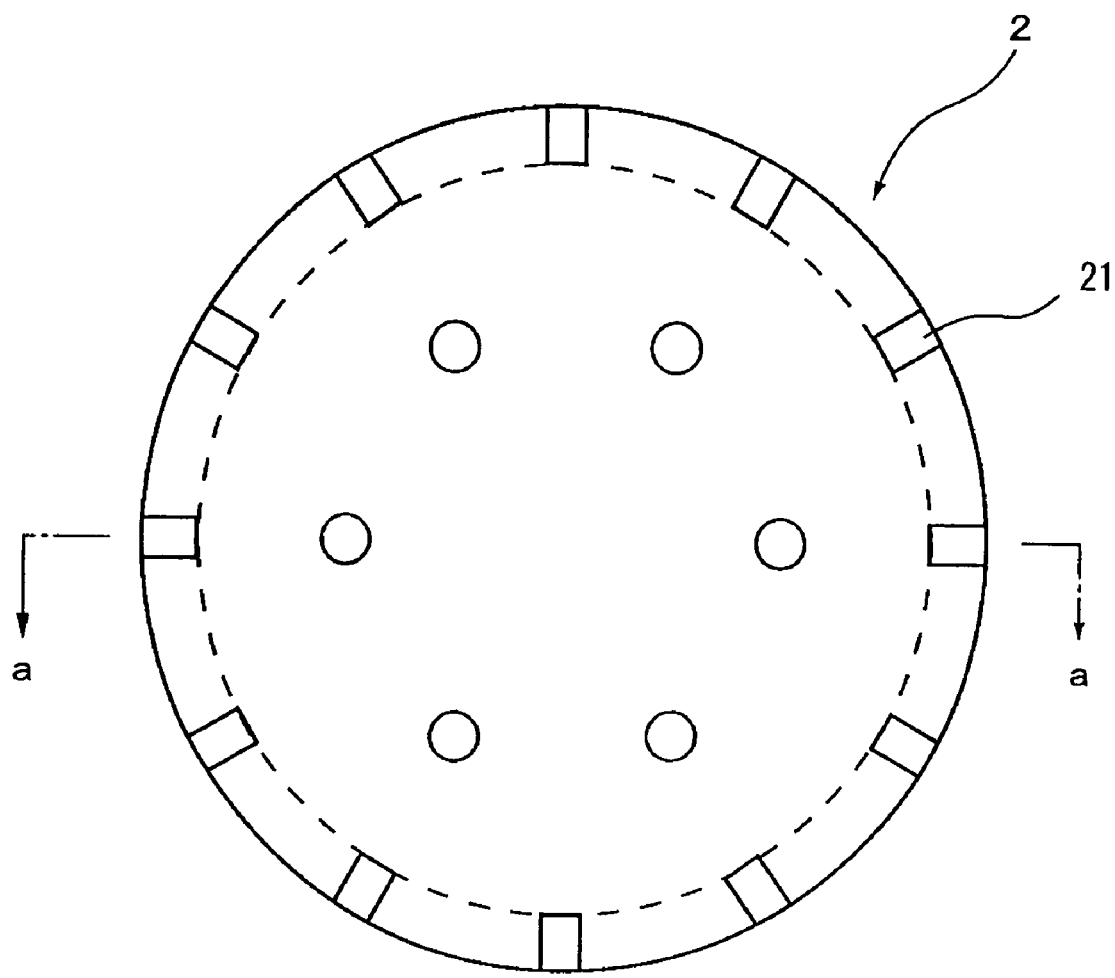
FIG. 3 shows an example of the planar structure of the support member of the present invention.

An embodiment of the present invention will be described with reference to FIG. 1. FIG. 1 is an example of an embodiment of the present invention. A wafer holder of the present invention is composed of a chuck top 1 for mounting a wafer; a support member 2 for supporting the chuck top; and a stand 3 for supporting the support member. In this case, the chuck top has a thermal conductivity K1 and a Young's modulus Y1 at normal temperature; the support member has a thermal conductivity K2 and a Young's modulus Y2 at normal temperature; and the stand has a thermal conductivity K3 and a Young's modulus Y3 at normal temperature. Also, K1>K2 and K1>K3; and Y3>Y1 and Y3>Y2. As shown in Figures 1,2 and 3. the chuck top 1, support member 2 and stand 3 are separate elements that are stacked together, one on top of the other with no fasteners shown holding the chuck top 1, support member 2 and stand 3 together. Therefore, the chuck top 1, support member 2 and stand 3 are separate from one another and separable from one another.

By making the thermal conductivity of the chuck top greater than the thermal conductivity of the support member, the heating uniformity of the wafer mounting surface of the chuck top can be improved. The support member and the stand should have a lower thermal conductivity in order to block heat from the chuck top and prevent disturbances in the positional accuracy of the wafer holder. For example, when a heat generator for heating the wafer is positioned below the chuck top, heat generated by the heat generator is conveyed by the chuck top and heats the wafer. Heat conveyed up to the surface of the support member (on the chuck-top side) can spread through the entire mounting surface and the heating uniformity can be increased by increasing the thermal conductivity of the chuck top. The volume of heat conveyed from the chuck top to the support member can be lessened by making the thermal conductivity of the support member lower than that of the chuck top. Specifically, the thermal conductivity is lower in the support member than in the chuck top. It is therefore possible to reduce the occurrence of cool spots, which cause a partial reduction in temperature by the escape of heat from the chuck top to the support member even in areas of contact with the chuck top, and to provide the chuck top with exceptional heating uniformity.

Grooves, holes, or the like for vacuum suction must be precisely machined on the chuck top part, as shown in FIG. 2, in order to vacuum-chuck the mounted wafer. If a highly rigid material is used as the chuck top, probing performance will improve; however, highly rigid materials are relatively difficult to machine, causing the processing cost to increase. Therefore, a material having a high thermal conductivity and a low rigidity (Young's modulus) is preferably used for the chuck top.

The stand acts to block heat from the chuck top and therefore is preferably made of a material having a relatively low thermal conductivity. The occurrence of warping, deformation, and the like due to the pressure during probing can be minimized by using a material whose rigidity is higher than that of the chuck top part. Since a material having a high Young's modulus is used in the stand, fashioning the stand into a complicated shape will increase the processing cost. Therefore, relatively simple structures are preferable for the shape of the stand. Conversely, making the support member that has a low Young's modulus, i.e., is inexpensive to process, into a relatively complicated structure having a strong heat-insulating effect for can still reduce the overall cost.

The support member must prevent heat from being conveyed to the stand while also reducing the amount of warping of the chuck top, which has a small Young's modulus. Therefore, a material having a lower thermal conductivity than that of the chuck top is used. The surface on which contact is made with the chuck top is processed, and the chuck top and the support member are designed so that instead of the entire surface of the support member contacting the chuck top, only protuberances 21 contact the chuck top, as shown in FIG. 3. The contact area between the chuck top and the support member can be made small by employing such a heat insulation structure, allowing heat conduction to be suppressed.

The heat insulation structure may have notched grooves formed in the support member. A thermally insulating structure can also be obtained by forming a notched groove in the chuck top. The notch may assume the form of concentric or radial grooves, multiple protuberances, or another configuration without particular limitation. However, a symmetrical shape is necessary for each of these shapes. If the shape is not symmetrical, the pressure applied to the chuck top will be unable to be dispersed uniformly, and the chuck top will be subjected to deformation, damage, or other problems, which is undesirable.

A plurality of pillar members are preferably disposed between the chuck top and the support member as an aspect of a heat insulation structure. Preferably, eight or more pillar members are evenly positioned in a concentric or similar arrangement. In particular, wafers have increased to sizes of 8 to 12 inches over the past several years; therefore, a smaller number of pillar members will particularly result in greater distances therebetween. Accordingly, warping between the pillar members will more readily occur when the pins of the probe card are pressed on the wafer mounted on the chuck top, which is undesirable. When the area over which contact is made with the chuck top is the same as when an integrated structure is used, interfaces can be formed between the chuck top and the pillar members and between the pillar members and the support member. The interfaces will therefore become a heat-resistant layer, and the heat-resistant layer can be increased by a factor of two, making it possible to efficiently insulate heat generated by the chuck top. The pillar members may assume the configuration of a cylinder, triangular prism, quadrangular prism, another polygonal prism, or a pipe, without particular restriction. Regardless of the configuration, the insertion of pillar members in this manner makes it possible to block heat emitted by the chuck top toward the support.

The materials of the pillar members used in the heat-insulation structure above preferably have a thermal conductivity of 30 W/mK or less. If the thermal conductivity is higher than 30 W/mK, the thermal insulation effect deteriorates, which is undesirable. Examples of materials that can be used for the pillar members include $Si_3N_4$; mullite; mullite-alumina complexes; steatite; cordierite; stainless steel; glass (fiber); polyimide, epoxy, phenol, and other heat-resistant resins; and complexes of any of the above.

The parts of the support member and the chuck top or the pillar members that come into contact preferably have a surface roughness Ra of 0.1 µm or greater. If the surface roughness Ra is less than 0.1 µm, the contact area between the support member and the chuck top or pillar member will increase and gaps between the parts will become relatively small. The volume of transmitted heat will therefore be larger than when the Ra is 0.1 µm or greater, which is undesirable. There is no particular upper limit regarding the surface roughness; however, if the surface roughness Ra is 5 µm or greater, surface processing will become more expensive. Grinding, sand blasting, or other treatments are preferably used to obtain a surface roughness Ra of 0.1 µm or greater. However, the appropriate grinding and blasting conditions must be used in order to restrict the Ra to 0.1 µm or greater. The heat-insulation structure can also be formed between the support member and a stand. In any configuration, effective heat insulation can be obtained by using such a structure.

A structure such as described above enables a wafer holder having good heating uniformity, high rigidity, and a low cost to be provided.

The material of the chuck top preferably has a high thermal conductivity, ideally 100 W/mK or more, in order to improve the heating uniformity of the wafer-mounting surface, but is otherwise without particular limitation. Processing is necessary in order to control the groove formation, flatness, surface roughness, and other properties of the wafer mounting surface so that a wafer can be held by a vacuum chuck on the chuck top. The surface flatness is preferably 50 µm or less, and the surface roughness Ra is preferably 0.1 µm or less. Materials that meet these criteria may include copper, aluminum, other materials having a metal as the primary component, or metal-ceramic complexes with silicon carbide, aluminum nitride, or the like added to one of the aforementioned metals. If a metal layer must be formed on the wafer-mounting surface of the chuck top, nickel, gold, or another metal can be plated, vapor-deposited, sputtered, or otherwise applied, thereby forming the metal layer.

The material of the support member must have a thermal conductivity lower than the chuck top in order to stop heat from being conveyed to the stand to the greatest extent possible when the wafer is heated, but is otherwise without particular limitation. Examples include alumina, mullite, complexes thereof, cordierite, silicon nitride, aluminum nitride, silicon carbide, or other ceramic materials. Metals having relatively low thermal conductivity may also be used, such as alloys of stainless steel and the like, or alloys of nickel, chromium, titanium, and the like. Metal-ceramic complexes may also be used.

The support member supports the chuck top at a plurality of locations (protuberances) as described above, and can therefore prevent deformation of the chuck top. When the chuck top is supported at numerous (a plurality of locations, the structure generally tends to be complex. Therefore, the metal used for these parts is preferably relatively easy to shape and process. The amount of machining can be reduced in particular by manufacturing methods such as casting and the like, which is preferable in allowing the support member to be formed at a lower cost. Additionally, using casting and other such formation methods is preferable in that notches, through-holes, and the like can thereby be relatively readily formed in the support member, allowing reductions in the amount of material used and in the weight of the support member.

A material having a Young's modulus that is higher than that of the chuck top, support member, and other components must be used in the stand. If a material having a relatively low Young's modulus is used for the chuck top, as described above, a material having a high Young's modulus must be used in the stand in order to inhibit deformation of the chuck top. The Young's modulus of the stand depends on the Young's modulus of the chuck top, but is preferably 200 GPa or greater even though a chuck top having a high Young's modulus can restrain overall deformation to some extent. If the Young's modulus of the stand is less than 200 GPa, the stand itself may deform, which is undesirable. A Young's modulus of 300 GPa or more is even more preferable. If the material has a Young's modulus of 300 GPa or greater, deformation of the stand can be greatly reduced, allowing the stand to be made smaller and lighter, which is especially preferable.

The stand also acts to prevent heat generated by the heat generator from being conveyed to the drive system; i.e., ensures positional accuracy. The thermal conductivity of the stand must therefore be lower than the thermal conductivity of the chuck top. If the thermal conductivity is higher than in the chuck top, heat that reaches the stand while a wafer is heated on the chuck top will be readily conveyed to the drive system below, and positional accuracy will not be maintainable. Therefore, the thermal conductivity of the stand is preferably 40 W/mK or less. If the thermal conductivity of the stand exceeds 40 W/mK, the heat applied to the chuck top will be readily conveyed to the stand and will affect the precision of the drive system, which is undesirable. Since probing has required high temperatures of 150° C. or greater over the past several years, the stand preferably has a thermal conductivity of 10 W/mK or less, and ideally 5 W/mK or less. If the thermal conductivity is of such a level, the amount of heat transmitted from the stand to the drive system will greatly decrease.

The choice of a material that meets these criteria depends on the material of the chuck top. Materials having such a Young's modulus include alumina, mullite, and complexes thereof aluminum nitride, silicon nitride, silicon carbide, cordierite, and other such ceramics; tungsten, molybdenum, and other metals having high melting points, as well as complexes of any of the above, complexes of silicon and silicon carbide, complexes of aluminum and silicon carbide, and other such complexes. As regards thermal conductivity, specific examples of suitable materials include mullite, alumina, complexes of mullite and alumina (mullite-alumina complexes), and cordierite. Mullite is preferred for its low thermal conductivity and strong heat-insulating effect, and alumina is preferred for its high Young's modulus and rigidity. Mullite-alumina complexes have a thermal conductivity that is lower than that of alumina, and a Young's modulus that is higher than that of mullite, and are therefore preferable overall.

Since a material having a relatively high Young's modulus is used in the stand, processing the stand into a prescribed shape necessarily involves high processing costs. The shape must therefore have a relatively simple structure. For example, the following operations are preferably be minimized in order to reduce costs: processes related to the flatness, parallelism, and surface roughness of the exterior or the upper and lower surfaces, as well as counter-sinking, threading, and other processes performed in order to fix chuck tops, support members, or portions in which electrodes or other elements are brought out.

In a preferred embodiment, the chuck top may be copper, a copper alloy, or another material having high thermal conductivity; the support member may be stainless steel, Kovar, or another material that has a relatively low thermal conductivity and can be readily shaped and machined; and the stand may be a mullite-alumina complex or another highly rigid material. Aluminum, alloys thereof, and the like may also be used in the chuck top in order to lighten the wafer holder.

A conducting layer can be formed on the wafer-mounting surface of the chuck top. The layer is formed in order to protect the mounting stage from corrosive gasses, acids, alkali chemicals, organic solvents, water, and other substances commonly used in semiconductor manufacturing processes; and to prevent electromagnetic noise originating below the mounting stage from entering the space below the wafer mounted on the mounting stage. The conductor layer therefore acts as a grounder.

There are no particular limitations regarding the method used to form the conductor layer. Examples of methods include applying a conductive paste by screen printing and then firing the resulting material, as well as vapor deposition, sputtering, spraying, plating, or another method. Among these methods, spraying and plating are particularly favorable. No heat treatment is performed when the conductor layer is formed with these methods. Therefore, the mounting stage will not warp due to a heat treatment, and the cost is relatively low, resulting in an inexpensive conductor layer having exceptional characteristics. Plated films in particular are denser and have higher electrical conductivity than sprayed films, and are therefore especially preferable. Nickel and gold are examples of materials that are used in plating and spraying. These materials have relatively high electrical conductivity and exceptional resistance to oxidation, and are therefore preferable.

The surface roughness Ra of the conductor layer is preferably 0.5 μm or less. If the surface roughness exceeds 0.5 μm, then when an element having a high heating value is measured, the heat generated by the element itself during probing will be impossible to disperse from the conductor layer or mounting stage, the temperature of the element will increase, and thermal fracturing may occur. A surface roughness Ra of 0.02 μm or less allows for the efficient dispersal of heat, and is therefore preferable.

The heater, cooling module, and other temperature control mechanisms may be positioned below the chuck top. A cooling module is used when cooling the wafer, chuck top, or other component; or during use at or below normal temperatures.

The cooling module may be moveable or fixed to the chuck top. With a moveable cooling module, the temperature can efficiently be increased in a short time for heating purposes by separating the cooling module from the chuck top; and, for cooling purposes, the cooling module is brought into contact with the chuck top to achieve rapid cooling. The method for making the cooling module move may employ an air cylinder, hydraulic device, or other raising/lowering means, and is not particularly limited. Using a moveable cooling module is preferred since the cooling rate will dramatically improve and throughput will increase without a reduction in the rate of temperature increase in the wafer and chuck top. Such a method is also preferable in that the cooling module will not deform under pressure from the cooling module because the probe card does not exert any pressure on the cooling module during probing; and the cooling performance is greater than that of air cooling, in which cool air is blown on the chuck top.

If the rate at which the wafer and chuck top are cooled is of greater importance, the cooling module may be fixed to the chuck top. If the wafer holder is used at a temperature lower than normal temperature, fixing the cooling module to the chuck top will result in more effective cooling, and is therefore preferable. A deformable and heat-resistant flexible material having high thermal conductivity can also be inserted between the chuck top and cooling module. By providing a flexible material that allows the degree of flatness and warping to be alleviated between the chuck top and cooling module with respect to each other, the contacting area can be widened further, and the cooling performance of a cooling module as an essential component can be further demonstrated. The cooling rate can therefore be increased. Examples of materials that can be used as the flexible material include silicon, epoxy, phenol, polyimide, and other heat-resistant materials; materials obtained by dispersing BN, silica, AlN, or another filler in the abovementioned resins in order to improve thermal conductivity; and foamed metals.

There are no particular limitations regarding the method for fixing the cooling module. For example, the cooling module can fixed using a mechanical technique such as screwing or clamping. When the chuck top and cooling module are fixed via screwing, the use of three or more screws or even six or more screws will increase adhesion between the members and further improve the cooling capacity, and is therefore preferable. In the present structure, the holding member and cooling module are fixed; therefore, a higher cooling rate can be achieved in comparison to when the members are moveable.

The chuck top and cooling module can also be integrated. There are no particular limitations regarding the materials used for the holding member and cooling module when the members are integrally formed. However, a flow channel through which a coolant is circulated must be formed in the cooling module, for which reason the difference between the thermal expansion coefficients of the chuck top and cooling module is preferably small, and, as shall be apparent, the components are preferably composed of the same material.

When the chuck top and cooling module are integrated, the abovementioned ceramic materials and ceramic/metal complexes can be used as the materials for the holding member. A flow channel for cooling is formed on a surface of the chuck top opposite the wafer-mounting surface. A chuck top with which a cooling module has been integrated can be fabricated by integrating a substrate composed of the same material as the chuck top via brazing, glass bonding, or another technique. As shall be apparent, the flow channel may be formed on the substrate of the attaching side, or on both substrates. The chuck top and cooling module can also be integrated by being screwed together. In such instances, a configuration must be devised in which the coolant or the like is prevented from flowing out from the resulting flow channel by using an O-ring or the like.

Integrating the chuck top and cooling module thus allows the wafer, mounting stage, and holding member to be cooled more quickly than when the chuck top and cooling module are fixed in the above-described manner.

Another conducting layer can be formed on the surface of the wafer-mounting surface in instances where the chuck top is composed of a metal, where the surface readily oxidizes or deteriorates, or where electrical conductivity is low. The layer can be formed by plating nickel or another oxidation-resistant material, or by combining plating and spraying in the above-described manner.

There are no particular limitations regarding the material of the cooling module. Aluminum, copper, and alloys thereof are preferred for their relatively high thermal conductivity, which allows the heat of the chuck top to be dispersed rapidly. A stainless steel, magnesium alloys, nickel, or another metal material can also be used. In addition, an oxidation-resistant metal film made from nickel, gold, or silver can be plated, sprayed, or otherwise formed on the cooling module in order to impart the cooling module with oxidation-resistance A ceramic material can also be used for the cooling module. There are no particular limitations regarding such a material. However, aluminum nitride and silicon carbide are preferable because of their relatively high thermal conductivity, which allows heat to be dispersed quickly from the chuck top. Silicon nitride and aluminum oxynitride have high mechanical strength and exceptional durability, and are therefore preferable. Alumina, cordierite, steatite, and other oxide ceramic materials are relatively inexpensive and therefore preferable. A variety of materials can thus be selected for the cooling module. Therefore, a material may be selected according to the application. Nickel-plated aluminum and nickel-plated copper are preferred among these materials for their exceptional resistance to oxidation, high thermal conductivity, and relatively low cost.

A coolant may also be circulated through the cooling module. Heat transmitted to the cooling module is thereby rapidly removed from the cooling module, which improves the rate at which the wafer holder is cooled, and is therefore preferable. Coolant must be circulated when the chuck top is used at a temperature lower than normal temperature. There are no particular limitations regarding the coolant circulated within the cooling module. Examples of coolants that can be selected include water and Fluorinert™. However, water is ideal when taking into account the magnitude of specific heat and cost. Liquid coolant may leak from the device, for which reason gasses such as nitrogen and atmospheric gas can also be circulated.

In a preferred example, two aluminum plates are prepared and a flow channel is machined or otherwise formed in one of the aluminum plates for use in circulating the coolant. The entire surface of the aluminum plate is plated with nickel in order to improve resistance to corrosion and oxidation. The other nickel-plated aluminum plate is then affixed together therewith. An O-ring or the like is inserted into the circumference of the flow channel in order to prevent the coolant from leaking out. The two aluminum plates are screwed or welded together.

Alternatively, two copper (oxygen-free copper) plates are prepared and a flow channel for circulating water is machined or otherwise formed in one of the copper plates. The other copper plate is simultaneously joined via brazing to a stainless steel pipe that acts as an inlet and outlet for the coolant. The entire surface of the joined cooling plate is plated with nickel in order to improve resistance to corrosion and oxidation. Additionally, as a separate aspect, a cooling module can be obtained by mounting a coolant-conveying pipe to a cooling plate composed of aluminum, copper, or another metal. A groove having a shape similar to the cross section of the pipe may be formed on the cooling plate, and the cooling efficiency can be further increased by affixing the pipe thereto. A resin, ceramic material, or other thermally conductive material may also be inserted as an intermediate layer in order to improve adhesion between the cooling pipe and the cooling plate.

In addition, a pipe composed of copper or another metal can be mounted on a plate having high thermal conductivity composed of aluminum, copper, or the like; and the coolant can be circulated through the pipe. There are no particular limitations regarding the method for mounting the pipe to the plate. Examples of techniques include brazing and screwing using metal bands. The plate can be counter-sunk and a pipe mounted in the resulting hole to increase the area of contact between the pipe and plate and improve cooling efficiency. A thermally conductive sheet can also be inserted between the pipe and plate to improve cooling efficiency.

In the present invention, a heat generator (heater) or other temperature control mechanism may also be attached. There are no particular limitations as to the attachment location, but when both cooling and heating capability must be provided, the cooling module is preferably attached below the chuck top first, and the heater second. The order of attaching the cooling module and the heater may be changed.

The resistance heat generator can be configured using a variety of structures. For example, a structure wherein a resistance-heat generator is sandwiched by mica or another insulator is simple and is therefore preferred. Metal materials can be used for the resistance heat generator. For example, a foil or the like made from nickel, stainless steel, silver, tungsten, molybdenum, chromium, or an alloy of these metals can be used as the resistance heat generator. Of these metals, stainless steel and Nichrome™ are preferable. Stainless steel or Nichrome™ can be used to form the circuit pattern of the resistance heat generator with relatively good precision by etching or other methods during the process of shaping the heat generator. These materials are also resistant to oxidation and inexpensive, and are therefore preferable in terms of withstanding usage for long periods of time even at high operating temperatures.

As long as the insulator that sandwiches the heat generator is heat-resistant, the composition thereof is not particularly limited. For example, silicone resins, epoxy resins, phenol resins, and the like may be used in addition to mica, as mentioned above. When the heat generator is sandwiched by such an insulating resin, a filler can be dispersed in the resin so that heat generated by the heat generator will be more evenly conveyed to the chuck top. The filler dispersed in the resin acts to increase the thermal conductivity of the silicone resin or other material. The composition of the filler is not particularly limited as long as the material does not react with the resin. Examples include boron nitride, aluminum nitride, alumina, and silica. The heat generator is screwed or otherwise mechanically fixed to a mounting part.

The resistance-heat generator can also be formed on the chuck top, cooling module, or other component by screen printing or another method. If the chuck top, cooling module, or other component is not an insulator, an insulation layer of glass or the like may be formed on the surface for forming the heat generator, whereupon the heat generator may be formed. There are no particular limitations as to the material used for the heat generator; examples include silver, platinum, palladium, alloys and mixtures thereof.

If a wafer holder as described above is mounted on a wafer holder for use in wafer inspection, an apparatus can be obtained with exceptional heating uniformity and heat insulation, as well as a low cost, which is therefore preferable.

WORKING EXAMPLE 1

The materials shown in Table 1 were prepared with a thickness of 12 mm and a diameter of 310 mm. Grooves as shown in FIG. 1 were formed thereon, and holes connecting the grooves were then machined. The surfaces were then plated with nickel, and the side containing the wafer-mounting surface was ground to a mirror finish with a flatness of 5 μm and a surface roughness Ra of 0.1 μm or less, resulting in a chuck top.

TABLE 1

| | Material | Thermal conductivity (W/mK) | Young's modulus (GPa) |
|---|---|---|---|
| 1 | Copper | 390 | 120 |
| 2 | Aluminum | 230 | 80 |
| 3 | Al—SiC | 150 | 130 |
| 4 | Aluminum nitride | 170 | 270 |
| 5 | Silicon nitride | 25 | 300 |

Figure 4:
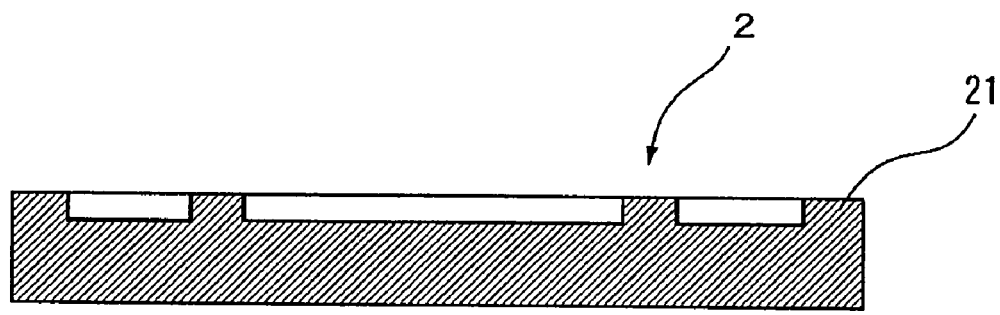
FIG. 4 shows the cross-sectional structure of along the line a-a in FIG. 3.

The materials shown in Table 2 were prepared with a thickness of 15 mm and a diameter of 310 mm to serve as support members. The upper and lower surfaces of these materials were polished and processed until the flatness and parallelism were each 10 μm or less. Then counter-sinks having a depth of 5 mm were formed in the shape shown in FIG. 3 and FIG. 4, resulting in a support member. Metal materials were cast and then finished.

TABLE 2

| | Material | Thermal conductivity (W/mK) | Young's modulus (GPa) |
|---|---|---|---|
| 6 | Stainless steel | 15 | 200 |
| 7 | Kovar | 17 | 140 |
| 8 | Al—SiC | 150 | 130 |

The materials shown in Table 3 were processed to a diameter of 310 mm and a thickness of 20 mm to serve as stands.

TABLE 3

| | Material | Thermal conductivity (W/mK) | Young's modulus (GPa) |
|---|---|---|---|
| 9 | Mullite-alumina complex | 8 | 280 |
| 10 | Alumina | 20 | 300 |
| 11 | Silicon nitride | 25 | 300 |
| 12 | Copper | 390 | 120 |

A heat generator was attached to each chuck top. The heat generator was a Nichrome™ foil having a thickness of 50 μm that, after being sandwiched by a silicone resin in which BN powder had been dispersed, was screwed to the chuck top using a stainless-steel plate. Assemblies composed of a chuck top, support member, and stand were heated to a temperature of 150° C., whereupon probing was carried out. The results are shown in Table 4. "⊚" denotes probing successfully carried out without problem, "○" denotes probing adequately carried out with some problems, and "X" denotes probing unable to be carried out due to dramatic deformation of the chuck top. The heating uniformity is the result of measuring the temperature nonuniformity of the wafer at 150° C.

TABLE 4

| | Chuck top | Support member | Stand | Probing results | Heating uniformity (± ° C.) | Cost |
|---|---|---|---|---|---|---|
| A | 1 | 6 | 9 | ⊚ | 0.7 | ⊚ |
| B | 1 | 6 | 10 | ⊚ | 0.7 | ⊚ |
| C | 1 | 6 | 11 | ⊚ | 0.7 | ○ |
| D | 1 | 7 | 9 | ⊚ | 0.7 | ○ |
| E | 1 | 8 | 9 | ⊚ | 0.8 | ○ |
| F | 2 | 6 | 9 | ⊚ | 0.8 | ⊚ |
| G | 3 | 6 | 9 | ⊚ | 0.9 | ○ |
| H | 4 | 6 | 9 | ⊚ | 0.8 | Δ |
| I | 5 | 6 | 9 | ○ | 1.5 | X |
| J | 1 | 6 | 12 | X | 0.8 | ⊚ |
| K | 1 | (6') | 9 | ⊚ | 0.7 | ○ |

It is clear from the results above that good assemblies had a copper or aluminum chuck top, a stainless steel support member, and an alumina or mullite-alumina complex stand. Sample I, which had a chuck top of silicon nitride, a support member of stainless steel, and copper instead of a mullite-alumina complex, had poor heating uniformity and a high cost. Sample J, in which the stand was composed of low-rigidity copper, had large deformations upon probing, and the probing could not be properly performed. Sample K had a support member that was a machined stainless steel plate. The cost of the support member was higher than with Sample A, which used cast stainless steel, but the heating uniformity and probing results were the same.

According to the present invention, it is possible to provide a wafer holder that has an excellent heat insulation structure, is light in weight, and is low in cost. The cooling rate of the wafer holder can also be improved by mounting a cooling module. Furthermore, the cost of manufacturing the wafer holder can be reduced, and the heating uniformity can be enhanced.

What is claimed is:

1. A wafer holder comprising:
   a chuck top configured and arranged to mount a wafer;
   a support member configured and arranged to support the chuck top, the support member being made from a metal or metal-ceramic complexes; and
   a stand configured and arranged to support the support member, wherein the chuck top, the support member and the stand are separate elements that are stacked together, with a heat insulation structure provided in the chuck top, the support member, or between the chuck top and the support member, and wherein
   the chuck top has a thermal conductivity $K1$ and a Young's modulus $Y1$,
   the support member has a thermal conductivity $K2$ and a Young's modulus $Y2$, and
   the stand has a thermal conductivity $K3$ and a Young's modulus $Y3$, with
   $K1>K2$ and $K1>K3$, and
   $Y3>Y1$ and $Y3>Y2$.

2. The wafer holder according to claim 1, wherein the chuck top is supported by a part of a surface of the support member.

3. The wafer holder according to claim 1, wherein the thermal conductivity $K1$ of the chuck top is 100 W/mK or greater.

4. The wafer holder according to claim 1, wherein the Young's modulus $Y3$ of the stand is 200 GPa or greater.

5. The wafer holder according to claim 1, wherein the support member is made of metal and is cast.

6. A heater unit adapted to be used in a wafer prober, comprising the wafer holder according to claim 1.

7. A wafer prober comprising the heater unit according to claim 6.

8. The wafer holder according to claim 1, wherein
   the heat insulation structure comprises: a protuberance or notched groove formed in the support; a notched groove formed in the chuck top; or a plurality of pillar members disposed between the chuck top and the support member.

* * * * *